United States Patent
Shiozawa (10) Patent No.: US 7,286,206 B2
(45) Date of Patent: Oct. 23, 2007

(54) EXPOSURE APPARATUS

(75) Inventor: Takahisa Shiozawa, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 11/552,958

(22) Filed: Oct. 25, 2006

(65) Prior Publication Data

US 2007/0053033 A1 Mar. 8, 2007

Related U.S. Application Data (63) Continuation of application No. 10/859,754, filed on Jun. 3, 2004, now Pat. No. 7,142,283.

(30) Foreign Application Priority Data

Jun. 6, 2003 (JP) ............................ 2003-162044

(51) Int. Cl.
*G03B 27/42* (2006.01)
*G03B 27/54* (2006.01)

(52) U.S. Cl. ................. 355/53; 355/67; 250/492.1; 250/492.2

(58) Field of Classification Search ............ 355/53, 355/67
See application file for complete search history.

(56) References Cited

U.S. PATENT DOCUMENTS

| 5,245,384 A | 9/1993 | Mori |
| 5,363,172 A | 11/1994 | Tokuda |
| 6,717,651 B2* | 4/2004 | Kato et al. ................. 355/55 |
| 2004/0125459 A1 | 7/2004 | Tanitsu et al. |

FOREIGN PATENT DOCUMENTS

JP 5-299321 A 11/1993

* cited by examiner

*Primary Examiner*—D. Rutledge
(74) *Attorney, Agent, or Firm*—Morgan & Finnegan, LLP (57) ABSTRACT

An exposure apparatus includes an illumination optical system that includes an optical integrator for forming a secondary light source from the light, and a variable stop arranged at or near a position where the secondary light source is formed, the diameter variable stop that defines a NA of the illumination optical system, a projection optical system that includes an aperture stop arranged at a position substantially optically conjugate with the variable stop, the aperture stop defining a numerical aperture of the projection optical system, and a controller for controlling the aperture diameter of the variable stop as the aperture diameter varies so that an image of the secondary light source can fall within the aperture diameter of the aperture stop.

2 Claims, 11 Drawing Sheets

EXPOSURE APPARATUS

This application is a continuation of prior Application Ser. No. 10/859,754, filed Jun. 3, 2004 now U.S. Pat. No. 7,142,283, which is hereby incorporated by reference herein in its entirety as if fully set forth herein. This application claims the right of priority under 35 U.S.C. § 119 based on Japanese Patent Application No. 2003-162044, filed on Jun. 6, 2003, which is hereby incorporated by reference herein in its entirety as if fully set forth herein.

BACKGROUND OF THE INVENTION

The present invention relates generally to an exposure apparatus, and more particularly to an exposure apparatus used to expose objects, such as single crystal substrates for semiconductor wafers and glass plates for liquid crystal displays ("LCD").

A reduction projection exposure apparatus has been conventionally employed that uses a projection optical system to project or transfer a circuit pattern on a reticle (or a mask) onto a wafer, etc., in order to manufacture fine semiconductor devices such as a semiconductor memory or a logic circuit in photolithography technology.

Recent demands for smaller and thinner profile electronic devices have increasingly called for finer semiconductor devices to be mounted onto these electronic devices. The exposure apparatus is required to have such high optical performance as the critical dimension (or resolution) on a wafer surface of 0.2 µm or, preferably, 0.1 µm.

The semiconductor industry has recently shifted its production to a highly value-added system chip that mixes a wide variety of patterns the reticles needing plural types of patterns. Reticle patterns include an adjacent and periodic line and space (L & S) pattern, a line of contact holes that are adjacent and periodic (i.e., arranged at the same interval as the holes diameters), isolated contact holes that are non-adjacent and isolated, other isolated patterns, etc. A transfer of a pattern with high resolution requires a selection of optimal exposure conditions in accordance with these kinds of patterns.

In order to handle exposure processes of various featured patterns, more specifically, to set an exposure condition suitable for each exposure process, an exposure apparatus has been proposed (for example, in Japanese Patent Application, Publication No. 5-299321) that can change a numerical aperture ("NA") in the projection optical system, an illumination condition, such as a coherence factor σ (i.e., a ratio of an illumination optical system's NA to a projection optical system's NA), and a σ distribution in the illumination area (for a so-called modified illumination, such as an oblique incidence illumination, a multi-pole illumination, and an off-axis illumination).

However, when the projection optical system's NA, the illumination optical system's NA and an effective light source shape are changed independently, the illumination light from the illumination optical system can be larger than the projection optical system's NA and disadvantageously shielded by the projection optical system. As a result, the imaging performance deteriorates and the light intensity becomes uneven. In particular, the recently frequently used modified illumination among the resolution-enhanced technology ("RET") has a large σ value, thus this problem is likely to happen.

The exposure apparatus proposed in the above reference includes a means for alarming an error or prohibiting an exposure action when an operator's setting causes the 0-th order light in illumination light, that passes through an illumination stop and the reticle, not to pass through the projection optical system. Thus, this reference arduously requires the operator to avoid this problem at the time of the setting.

In addition, as the off-axis telecentricity is adjusted for corrections of on-axis and off-axis telecentricity, the outline of the σ distribution decenters, the projection optical system can similarly shield the illumination light, and the imaging performance deteriorates. It is therefore important that the illumination light (in particular, the 0-th order light) enters the projection optical system in view of its NA even when the σ distribution decenters.

BRIEF SUMMARY OF THE INVENTION

Accordingly, it is an exemplified object of the present invention to provide an exposure apparatus that prevents shielding of the illumination light and provides excellent imaging performance.

An exposure apparatus of one aspect according to the present invention includes an illumination optical system for illuminating a reticle using light from a light source, wherein the illumination optical system includes an optical integrator for forming a secondary light source from the light, and a variable stop arranged at or near a position where the secondary light source is formed, the variable stop being configured to vary an aperture diameter that defines a numerical aperture of the illumination optical system, a projection optical system for projecting a pattern on the reticle onto an object to be exposed, wherein the projection optical system includes an aperture stop arranged at a position substantially optically conjugate with the variable stop, the aperture stop defining a numerical aperture of the projection optical system, and a controller for controlling the aperture diameter of the variable stop in the illumination optical system as the aperture diameter of the variable stop varies so that an image of the secondary light source formed at or near the aperture stop can fall within the aperture diameter of the aperture stop.

An illumination apparatus of another aspect according to the present invention for illuminating a surface using light from a light source includes a condenser optical system that includes at least two groups of optical systems for introducing the light into the surface, wherein the condenser optical system makes a focal length and a back principal point position of the condenser optical system substantially constant, while making a front principal point position of the condenser optical system variable.

An illumination apparatus of still another aspect according to the present invention for illuminating a surface using light from a light source includes an optical integrator for forming a secondary light source from the light, and a condenser optical system that introduces the light from the optical integrator into the surface, and includes at least two groups of optical systems, wherein the condenser optical system makes a focal length and a back principal point position of the condenser optical system substantially constant, while making a front principal point position of the condenser optical system variable.

An illumination apparatus of still another aspect according to the present invention for illuminating a surface using light from a light source includes a zooming optical system for introducing the light to an optical integrator and for adjusting a size of a secondary light source formed by the optical integrator, and a condenser optical system that introduces the light from the optical integrator to the surface to be illuminated, and includes at least two or more optical elements, wherein the zooming optical system adjusts the size of the secondary light source in accordance with an adjustment of an interval between the optical elements that constitute the condenser optical system.

An exposure apparatus of another aspect according to the present invention includes the above illumination optical system, and a projection optical system for projecting a pattern on a reticle illuminated by the illumination optical system, onto an object to be exposed.

A device fabricating method of still another aspect of the present invention includes the steps of exposing an object using the above exposure apparatus, and performing a predetermined process for the exposed object. Claims for a device fabricating method that performs operations similar to that of the above exposure apparatus cover devices as intermediate and final products. Such devices include semiconductor chips like an LSI and VLSI, CCDs, LCDs, magnetic sensors, thin film magnetic heads, and the like.

Other objects and further features of the present invention will become readily apparent from the following description of the preferred embodiments with reference to accompanying drawings.

DETAILED DESCRIPTION OF THE PREFERRED EMBODIMENTS

Figure 1:
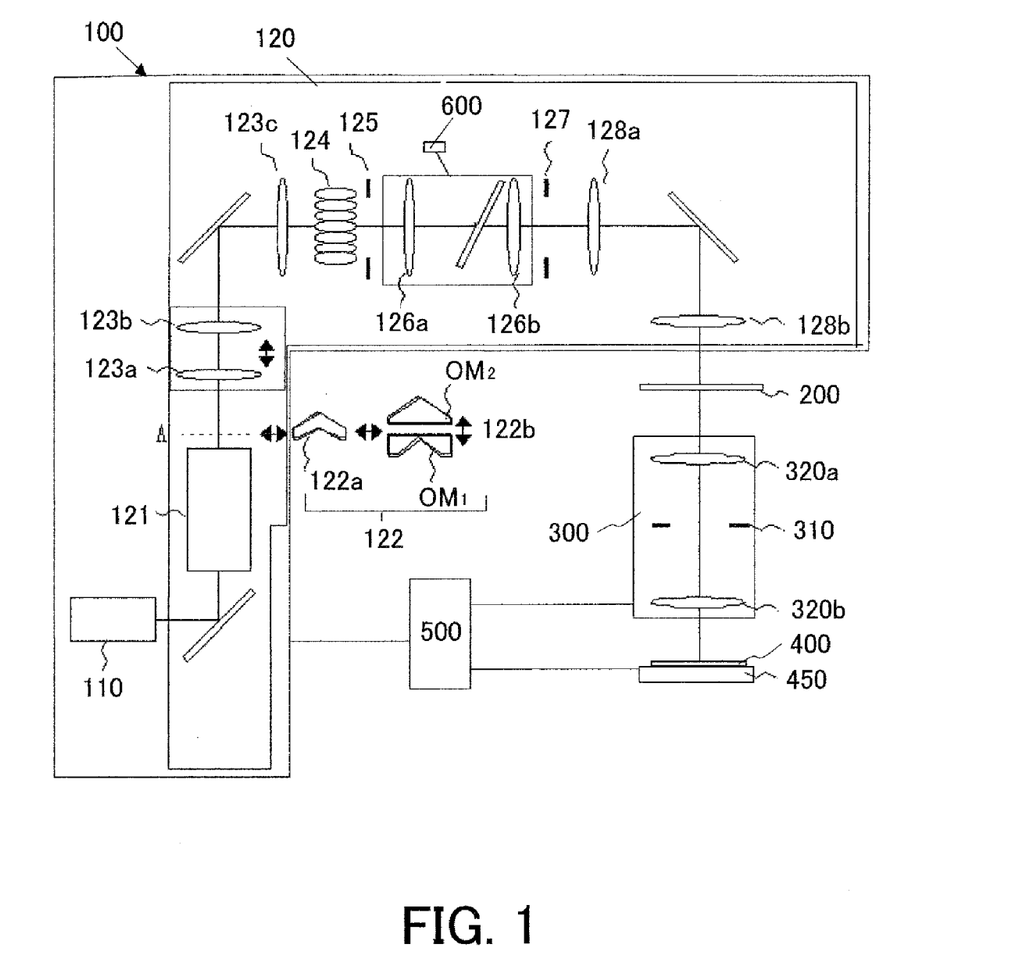
FIG. 1 is a schematic structural view of an exposure apparatus of one embodiment according to the present invention.

Referring now to the accompanying drawings, a description will be given of an exposure apparatus 1 according to the present invention. Each element in each figure is designated by the same reference numeral, and a duplicate description will be omitted. FIG. 1 is a schematic structural view of the exposure apparatus 1. The exposure apparatus 1 includes, as shown in FIG. 1, an illumination apparatus 100, a reticle 200, a projection optical system 300, a plate 400, and a controller 500. The exposure apparatus 1 is a projection exposure apparatus that exposes onto the plate 500 a circuit pattern created on the reticle 200, for example, by a step-and-repeat or by a step-and-scan manner.

The illumination apparatus 100 illuminates the reticle 200, and includes a light source section 110 and an illumination optical system 120.

The light source section 110 employs, for example, lasers such as an ArF excimer laser with a wavelength of approximately 193 nm, or a KrF excimer laser with a wavelength of approximately 248 nm, etc., but the type of laser is not limited to an excimer laser, and an $F_2$ excimer laser with a wavelength of approximately 157 nm can be used. The number of light sources is also not limited. When the light source section 110 uses a laser, it is desirable to employ a beam shaping optical system that shapes a parallel beam from a laser source to a desired beam shape, and an incoherently turning optical system that turns a coherent laser beam into an incoherent one. A light source applicable to the light source section 110 is not limited to the laser, but may use one or more lamps such as a mercury lamp, xenon lamp, etc.

The illumination optical system 120 is an optical system for illuminating the reticle 200, and includes a lens, a mirror, an optical integrator, a stop, etc. The illumination optical system of the instant embodiment includes a uniform ray forming means 121, a shaping means 122, a zooming (or imaging) optical system 123a to 123c, a fly-eye lens 124, a variable stop 125, a condenser optical system 126, a masking blade 127, and imaging optical systems 128 and 128b. A detailed description of the illumination optical system will be given later.

The reticle 200 is made from quartz, for example, and forms a circuit pattern (or an image) to be transferred, and is supported and driven by a reticle stage (not shown). Diffracted light emitted from the reticle 200 passes through the projection optical system 300, and then is projected onto the plate 400. The reticle 200 and the plate 400 are located in an optically conjugate relationship. The exposure apparatus 1 of the instant embodiment is a scanner, and the reticle 200 and the plate 400 are scanned at a speed ratio corresponding to a reduction ratio to transfer the pattern on the reticle 200 onto the plate 400. If it is a step-and-repeat exposure apparatus (referred to as a "stepper"), the reticle 200 and the plate 400 remain still for the exposure.

The projection optical system 300 is an optical system for projecting light that reflects the pattern on the reticle 200 onto the plate 400. The projection optical system 300 has an aperture stop 310 that defines an arbitrary NA. The aperture stop 310 has a variable aperture diameter that defines the NA of an imaging ray on the plate 400, and varies the aperture diameter to adjust the NA if necessary. In the instant embodiment, σ is a ratio between the diameter of an image of each light source formed by a fly-eye lens 124 at a position of the aperture stop 310 and the aperture diameter of the aperture stop 310.

The projection optical system 300 of the instant embodiment is an optical system that includes only plural lens elements 320a and 320b, but may also be a catadioptric optical system comprised of a plurality of lens elements with at least one concave mirror, an optical system comprised of a plurality of lens elements and at least one diffraction optical element such as a kinoform, a catoptric optical system including only mirrors, and so on. Any necessary correction of a chromatic aberration in the projection optical system 300 can use a plurality of lens units made from glass materials having different dispersion values (Abbe values), or arrange a diffraction optical element such that it disperses in a direction opposite to that of the lens unit.

The plate 400 is a wafer in the instant embodiment, but may include a liquid crystal plate and a wide range of other objects to be exposed. A photoresist is applied onto the plate 400.

The plate 400 is supported by the plate stage 450. The plate stage 450 may use any structure known in the art, and a detailed description of its structure and operations is omitted. For example, the plate stage 450 uses a linear motor to move the plate 400 in X-Y directions. The reticle 200 and plate 400 are, for example, scanned synchronously, and the positions of the reticle stage (not shown) and plate stage 450 are monitored, for example, by a laser interferometer and the like, so that both are driven at a constant speed ratio. The plate stage 450 is installed on a surface plate stool supported on the floor and the like, for example, via a dumper, while the reticle stage (not shown) and the projection optical system 300 are installed on a barrel surface (not shown) supported by the base frame placed on the floor, for example, via a dumper.

The controller 500 includes a CPU (not shown) and a memory (not shown), and controls the actions of the exposure apparatus 1. The controller 500 is electrically connected to the illumination apparatus 100, the reticle stage (not shown), the projection optical system 300, and the plate stage 450. The controller 500 controls the aperture diameter of a variable stop 125 in the illumination optical system 120 so that an image from the secondary light source, formed by the fly-eye lens 124 at a position of the aperture stop 310 in the projection optical system 300, falls within the aperture diameter of the aperture stop 310. The controller 500 controls the aperture diameter of the variable stop 125 in the illumination optical system 120 so that $\sigma \leq (x-1)/x$ where x is the number of fine lenses in the fly-eye lens 124 corresponding to $\sigma = 1$. The fly-eye lens 124 serves as an optical integrator and generally includes twenty or more optical elements (such as fine lenses). The controller 500 controls the ratio between the illumination optical system 120's NA and the projection optical system 300's NA so that (the illumination optical system 120's NA)/(the projection optical system 300's NA) is less than or equal to, for example, 0.95. The controller 500 may serve as an adjuster 600, which will be described later.

A description will now be given of the illumination optical system 120, with reference to FIGS. 2 to 10. The light emitted from the light source section 110 that has an excimer laser, etc., is converted into an approximately uniform light distribution on a predetermined surface A by a uniform ray forming means 121. The uniform ray forming means 121 includes at least one of the following: a fly-eye lens, an optical pipe that uses internal reflections, a diffraction grating, etc., or a combination thereof, such as a plurality of optical integrators, a relay optical system, a condenser optical system, a mirror, etc. The uniform ray forming means 121 varies light from the light source section 110 into a desired uniform light distribution on the predetermined surface A. The predetermined surface A may arrange a stop having a circular or octagonal shape to limit the light distribution into a XY symmetrical distribution.

A shaping means 122 makes the center part of the secondary light source formed by the fly-eye lens darker than the peripheral part, and is removably located near the predetermined surface A.

Figure 5A:
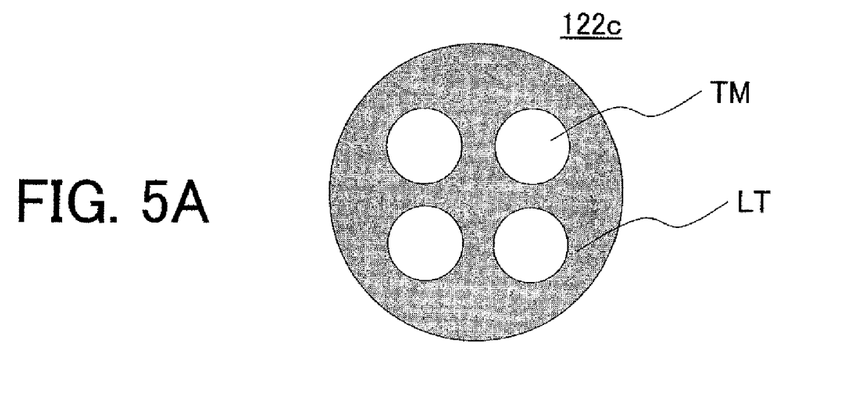
FIGS. 5A to 5C are schematic plane views of various aperture stops applicable to the shaping means shown in FIG. 1.
Figure 5B:
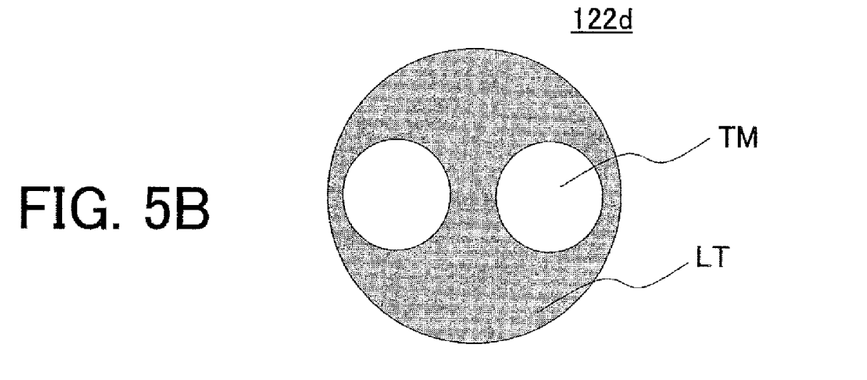
Figure 5C:
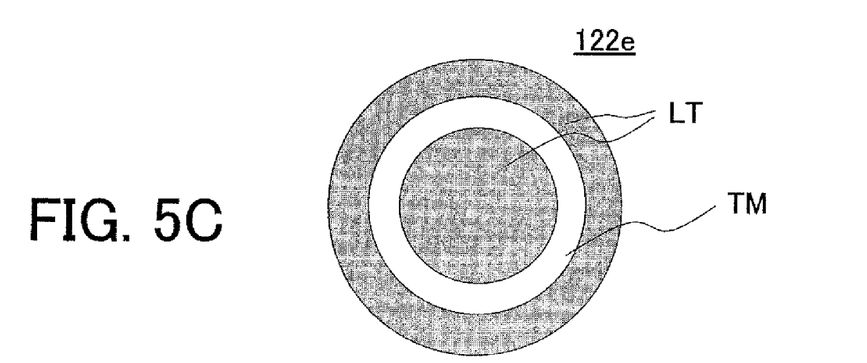

The shaping means 122 can use a conical optical element 122a, an interval variable conical optical element 122b, a properly shaped stop, such as a quadrupole aperture stop 122c shown in FIG. 5A, a dipole aperture stop 122d shown in FIG. 5B, and an annular aperture stop 122e shown in FIG. 5C, a parallel plate (not shown), a pyramidal optical element (not shown), a triangle pole shaped optical element (not shown), a variable stop that can change a shape and/or a diameter, a filter having a proper transmittance distribution, or a modification-variable enlargement/reduction beam expander.

The shaping means 122 can arrange some of these elements on the optical axis at the same time.

The conical optical element 122a has a concave conical incident surface, and a convex conical exit surface, and serves to form an annular ray when located along the optical axis.

The conical optical element 122b includes an optical element $OM_1$ that has a concave conical incident surface and a flat exit surface, and a pyramidal optical element $OM_2$ that has a flat incident surface and a convex conical exit surface. The conical optical element 122b when located along the optical axis forms an annular ray. The adjusting of an interval between the optical elements $OM_1$ and $OM_2$ can change the size of the annulus (or an annular ratio). Such a structure of the conical optical element 122b can efficiently form the annular ray in a small space. The optical elements $OM_1$ and $OM_2$ have approximately the same conical surface angle. The same angle would reduce the angle of the exit light from the shaping means 122, and minimize the shielding of light by the subsequent optical systems. When the subsequent optical system has angular latitude, these angles are not necessarily made the same, but may be different, for example, in order to reduce an annular width.

Similar to the conical optical element 122b, is an interval variable quadrupole conversion element that has an incident side optical element with a concave pyramidal incident surface and an exit side optical element with a convex pyramidal surface. A triangle pole shaped, dipole conversion element is also applicable. The shaping means 122 uses such a proper transmission optical element and can convert a ray shape into one in which the peripheral part has a larger light intensity distribution than that of the central part.

FIG. 5A is a schematic plane view of the quadrupole aperture stop 122c that has a light shielding part LT, and quadrupole light transmitting parts TM, each having a circular opening with a transmittance of 1. The transmitting parts TM are arranged at ±45° and ±135°. Preferably, each transmitting part TM provides the same σ to the illumination light. The transmitting parts TM can be formed in directions of 0°, 90°, 180° and 270° or have different sizes according to patterns on the reticle 200. The transmitting part TM may have such various shapes as a rectangle, another polygon, or part of a sector. FIG. 5B is a schematic sectional view of the dipole aperture stop 122d having a light shielding part LT and dipole light transmitting parts TM having circular openings with a transmittance of 1. FIG. 5C is a schematic plane view of an annular aperture stop 122e having a light shielding part LT and a light transmitting part TM having an annular opening with a transmittance of 1.

A magnification-variable zooming optical system (123a to 123c) varies a magnification of the circular shaped ray formed on the predetermined surface A or the ray that has been desirably shaped by the shaping means 122. The circularly or desirably shaped ray enters the incident surface of the fly-eye lens 124 that serves as the optical integrator.

The fly-eye lens 124 serves as the optical integrator, and forms a plurality of light source images or secondary light sources near the exit surface of the fly-eye lens 124 from the incident light. The variable stop 125 is provided near the surface, on which the plural light source images are formed. The variable stop 125 is located at a position that slightly defocuses (by ± several millimeters) from the surface, on which the plural light source images are formed (or a back focal surface of the fine lenses that form the fly-eye lenses) because the surface has a comparatively high energy density of light. When the variable stop 125 endures the energy density, the variable stop 125 can be located on the surface, on which the plural light source images are formed.

The variable stop 125 can vary an aperture diameter that defines the illumination optical system 120's NA. The aperture diameter is varied according to the projection optical system 300's NA, as discussed later. The variable stop 125 and the aperture stop 310 are arranged in a substantially optically conjugate relationship. The fly-eye lens 124 forms multiple light sources at the exit surface side of the variable stop 125, and their images formed at the position of the aperture stop 310 provide a shape of the illumination ray (or an effective light source shape) at respective points on the plate 400 surface. The multiple light sources formed by the fly-eye lens 124 are not restricted by the variable stop 125, and are referred to as "secondary light sources" hereinafter.

Among rays from the multiple light source images, rays that are not restricted by the variable stop 125 illuminate the masking blade 127's surface via the condenser optical systems 126a and 126b. The masking blade 127 is arranged, via the imaging optical systems 128a and 128b, at a surface substantially optically conjugate with the surface where the reticle 200 is arranged. The masking blade 127 defines an illuminated area on the reticle 200's surface.

When the images of the secondary light sources at the aperture stop 310 position in the projection optical system 300 are larger than the aperture stop 310, the direct light that has transmitted through the illumination optical system 120 (or the 0-th order light from the reticle 200) is shielded by (the light shielding part on) the aperture stop 310 in the projection optical system 300. As a result, as discussed, is that the imaging performance deteriorates and the light intensity becomes uneven, negatively affecting the semiconductor device manufacture.

Accordingly, the inventive exposure apparatus 1 uses the controller 500 to control the aperture diameter of the variable stop 125 in the illumination optical system 120 as the projection optical system 300's NA varies, so that the 0-th order light from the reticle 200, which has passed through the variable stop 125 in the illumination optical system 120, falls within the aperture diameter in the aperture stop 310 in the projection optical system 300. In other words, the controller 500 controls the illumination optical system 120's NA so that the 0-th order light from the reticle 200 is not shielded by the aperture stop 310 in the projection optical system 300.

Figure 2:
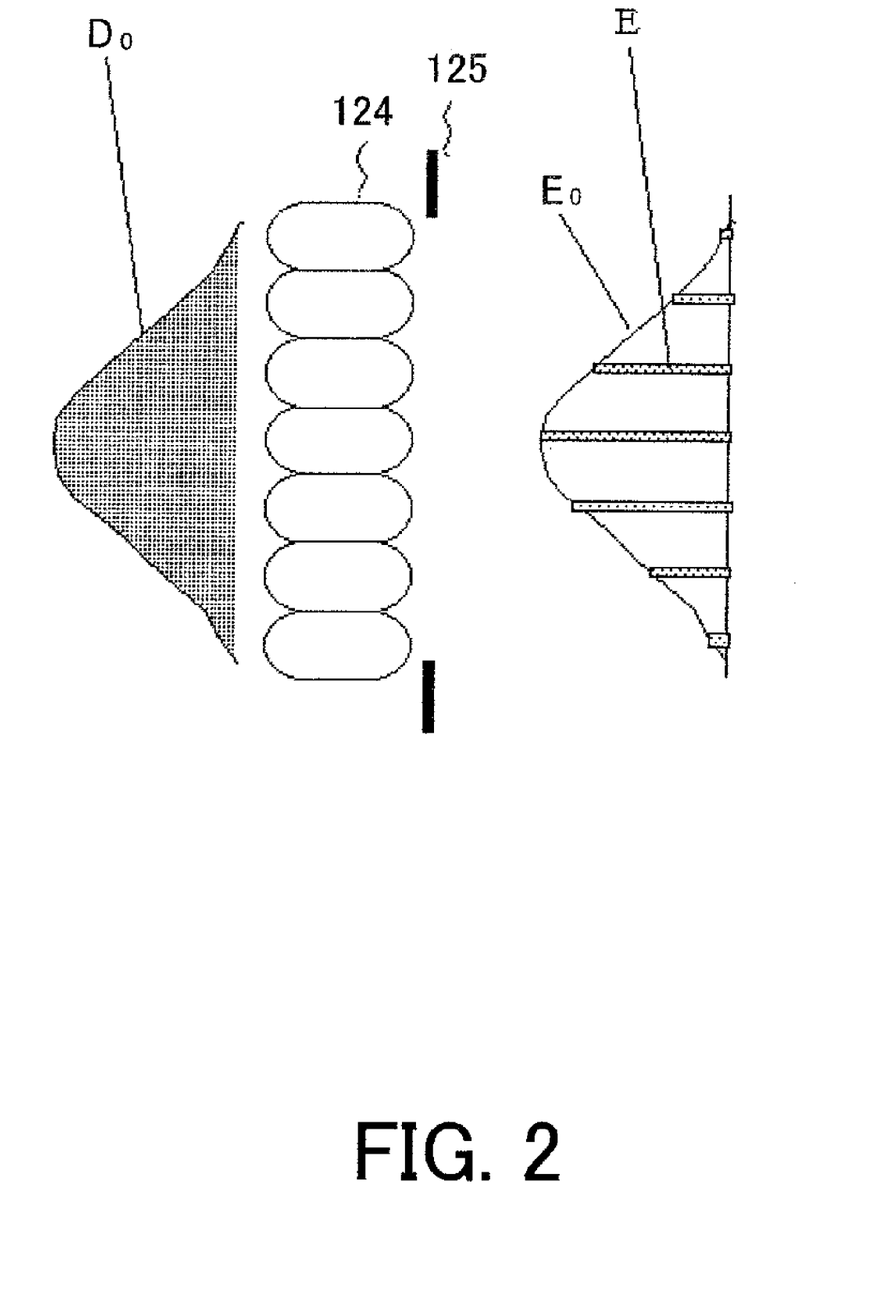
FIG. 2 is a schematic view showing an exemplary relationship between the light intensity distribution on the incident surface and that on the exist surface of a fly-eye lens shown in FIG. 1.

FIG. 2 is a schematic view showing an exemplary relationship between a light intensity distribution on the incident surface and that on the exist surface of the fly-eye lens 124 shown in FIG. 1. However, strictly speaking, FIG. 2 exemplarily shows a relationship between a light intensity distribution on the incident surface of the fly-eye lens 124 and that of the secondary light sources formed near the variable stop 125.

In FIG. 2, $D_0$ is an exemplary light intensity distribution on the incident surface of the fly-eye lens 124, and E is an exemplary secondary light source. The light source distribution of light emitted from the light source section 110 is converted into a discrete distribution corresponding to the fine lenses in the fly-eye lens 124 when the light passes through the fly-eye lens 124. The peak outline $E_0$ that connects peak values of the discrete distribution has approximately the same shape as that of the light intensity distribution $D_0$ for the aperture diameter of the variable stop 125 in the illumination optical system 120. Substantially, the light intensity distribution $D_0$ and the aperture diameter of the variable stop 125 determine a shape of the secondary light source.

Figure 3A:
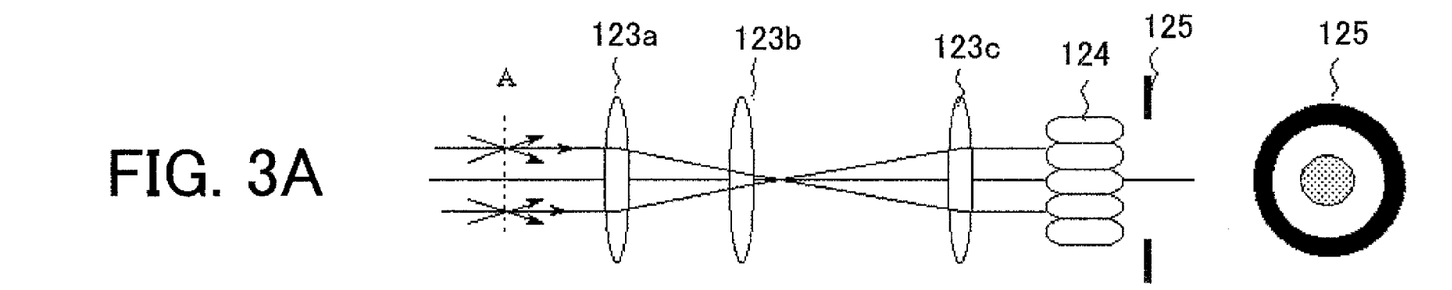
FIGS. 3A, 3B and 3C each illustrates an enlarged view of a principal part of the exemplary illumination system as shown in FIG. 1 with different optical condition.
Figure 3B:
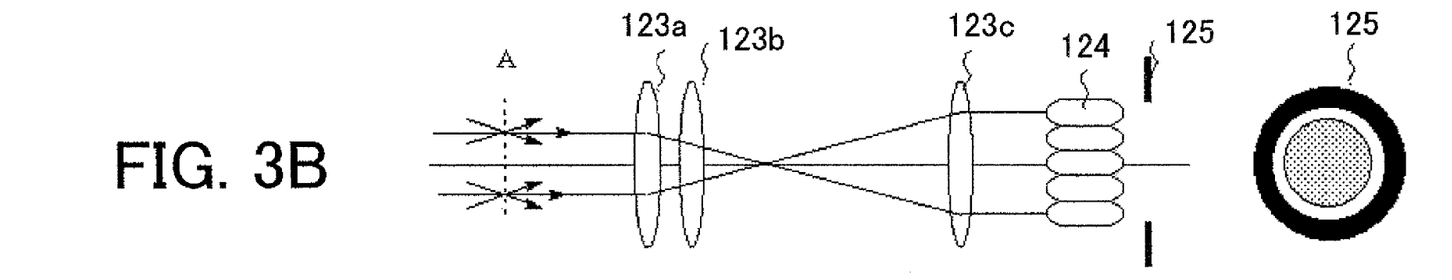
Figure 3C:
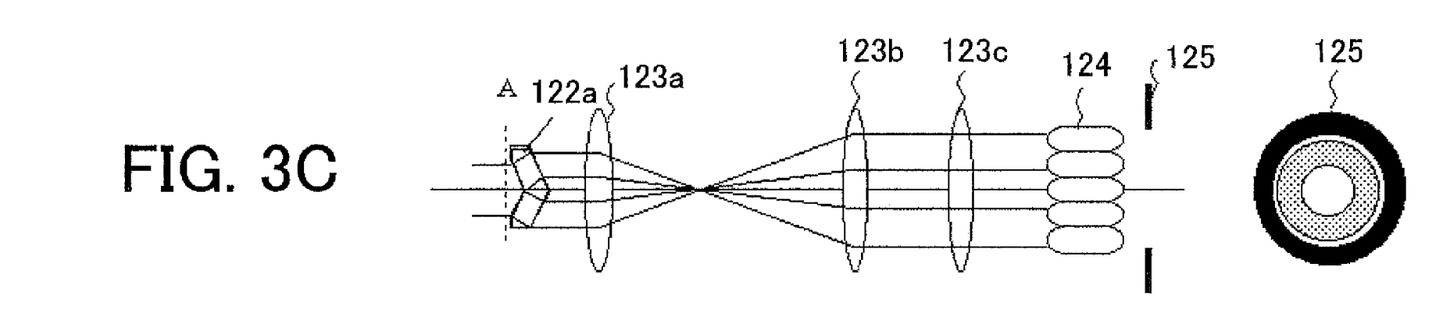

FIG. 3 is an enlarged view of a principal part in an exemplary illumination optical system 120 in the exposure apparatus 1 shown in FIG. 1. FIG. 4 is a schematic sectional view showing a ray shape in a variable stop 125 in the illumination optical system 120 shown in FIG. 1.

FIG. 3A shows so-called normal illumination where the shaping means 122 is retreated from the optical path or where a circular stop or a parallel plate is arranged near the predetermined surface A. As illustrated, the uniform ray forming means 121 forms a substantially circular shaped ray with a uniform light intensity distribution on the predetermined surface A. Due to the uniform ray forming means 121, rays from plural angles overlap each other and form a uniform light intensity distribution on the predetermined surface A; even when the light source section 110 uses a light source having strong directivity such as a laser, the light can maintain a certain NA as shown by an arrow in FIG. 3A.

The magnification-variable zooming optical system (123a-123c) projects the light intensity distribution on the predetermined surface A onto the incident surface of the fly-eye lens 124 at a predetermined magnification. The light intensity distribution when imaging on the incident surface of the fly-eye lens 124 without aberration would exhibit a sharp outline, and causes uneven light intensity and uneven effective light source on the screen of the plate 400 that serves as an exposed surface. Therefore, imaging between the predetermined surface A and the incident surface of the fly-eye lens 124 preferably needs aberration (including defocusing) to some extent. This is not true when the fly-eye lens 124 includes many fine lenses and the influence on the uneven light intensity, etc. is small. Blurs corresponding to about one or more fine lenses are usually preferable. FIG. 4D is a sectional view of a light intensity distribution $F_4$ in such a state.

As described with reference to FIG. 2, the light intensity distribution of the fly-eye lens 124 substantially determines the shape of the secondary light source (or an effective light source). In FIG. 3A, the secondary light source is small enough for the variable stop 125 in the illumination optical system 120. In order to change a σ value (effective σ value that considers the distribution), the magnification-variable zooming optical system (123a to 123b) varies a magnification as shown in FIG. 3B. While the instant embodiment varies the σ value by changing an interval between the optical systems 123a and 123b, any other configuration can be available as long as the magnification becomes variable. A zooming optical system that approximately maintains the telecentricity at the exit side of the light is preferable when the magnification changes (so that the light incident upon the fly-eye lens does not exceed a certain incident angle after the magnification is changed). When the zooming optical system (123a-123c) has a small magnification variable range, the shaping means 122 can employ the (enlargement/reduction) beam expander and a stop having a small opening diameter. FIG. 4E shows a large σ value that forms a light intensity distribution $F_5$ slightly larger than the aperture diameter in the variable stop 125 in the illumination optical system 120, and the light that exceeds the aperture diameter in the variable stop 125 is shielded as unnecessary light. Such a configuration effectively switches the normal illumination between about σ=0.1 to about σ=0.9.

The exposure apparatus 1 allows the controller 500 to automatically vary the aperture diameter in the variable stop 125 in the illumination optical system 120 in accordance with the set NA in the projection optical system 300. The controller 500 sets the aperture diameter of the variable stop 125 so that its mechanical size is a fixed value that satisfies that σ is about 0.95 or smaller for the projection optical system 300's NA. Alternatively, the fixed value itself can be changed.

FIG. 3C shows the illumination optical system 120 for the annular illumination. The conical optical element 122a and annular aperture stop 122c convert a circular light intensity distribution formed on the predetermined surface A into an annular shape, and the annular light intensity distribution is projected onto the incident surface of the fly-eye lens 124 at a proper magnification for so-called annular illumination. In this case, the controller 500 automatically sets the aperture diameter of the variable stop 125 in the illumination optical system 120 in accordance with the projection optical system 300's NA so that its mechanical size is a fixed value that satisfies that σ is about 0.95 or smaller.

Figure 4A:
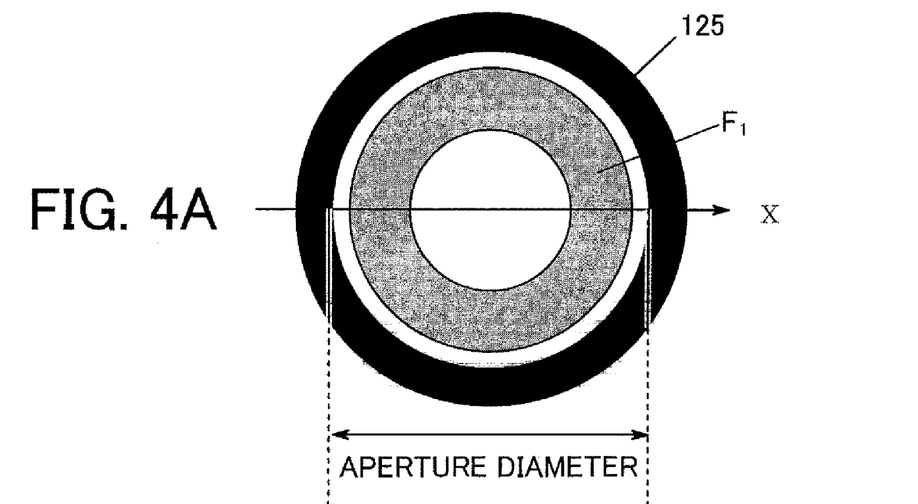
FIGS. 4A, 4B, 4C, 4D and 4E each illustrates a schematic sectional view of a ray shape corresponding to a variable stop in the illumination optical system shown in FIG. 1.
Figure 4B:
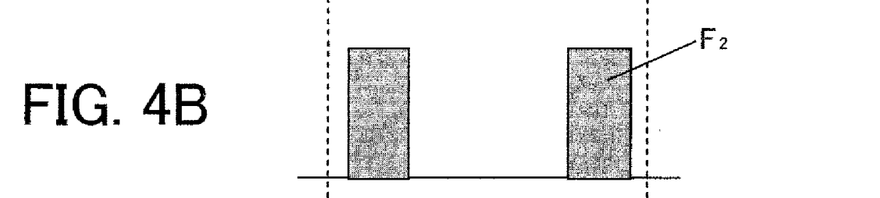

FIG. 4A shows a relationship between the variable stop 125 in the illumination optical system 120 for the annular illumination and the secondary light source (or effective light source). Referring to FIG. 4A, the annular light intensity distribution $F_1$ is formed within the aperture diameter in the variable stop 125. FIG. 4B shows a sectional light intensity distribution $F_2$ that is a section of the annular light intensity distribution $F_1$ shown in FIG. 4A in an X direction.

Figure 4C:
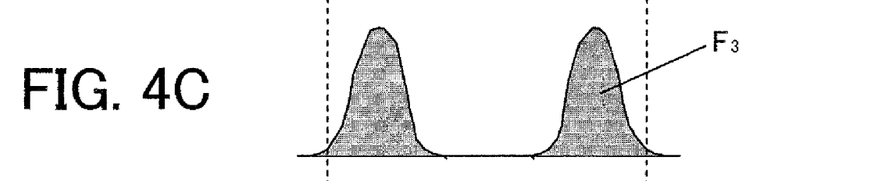
Figure 4D:
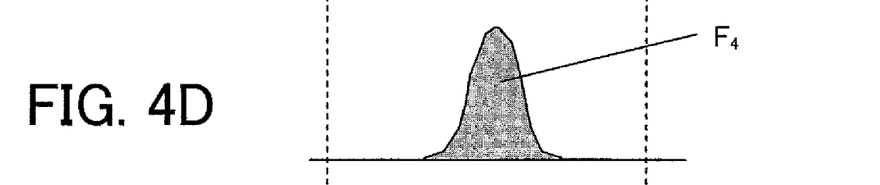
Figure 4E:
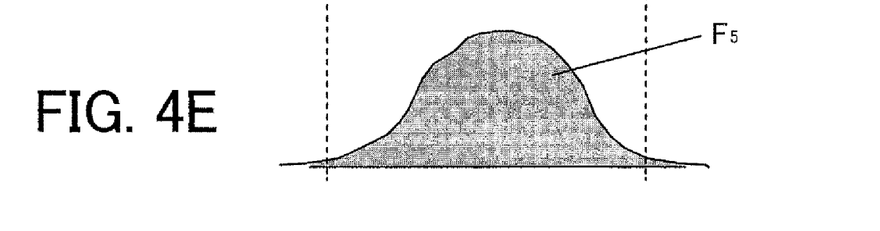

In the case of the annular illumination, the sectional light intensity distribution $F_2$ is usually defined as a flat distribution, as shown in FIG. 4B. However, it is difficult to effectively form the flat sectional light intensity distribution $F_2$, and a pursuit of efficiency would result in the sectional light intensity distribution $F_3$ having a uneven distribution as shown in FIG. 4C. As a result of a simulation, etc. of the imaging performance, the sectional light intensity distribution $F_3$ is selected for performance purposes, which is approximately equivalent to the sectional light intensity distribution $F_2$ shown in FIG. 4B.

The annular illumination is often used to image fine patterns. The effective outer σ, which is the size outside the annular shape when the imaging performance is converted into the flat sectional light intensity distribution $F_2$ shown in FIG. 4B, often uses about 0.9 for the annular illumination. In this case, as shown in FIG. 4C, the small part that is located outside the sectional light intensity distribution $F_2$ has a σ of 0.95 or greater, possibly deviating the light from the aperture diameter in the aperture stop 310 in the projection optical system 300. Therefore, the exposure apparatus 1 allows the controller 500 to control the size of the aperture diameter in the variable stop 125 in the illumination optical system 120 in accordance with the projection optical system 300's NA while maintaining σ to be about 0.95, and adjusting the light intensity distribution to provide the desired annular illumination.

As discussed, the inventive exposure apparatus 1 automatically varies the illumination optical system 120's NA according to the set NA of the projection optical system 300, facilitating the operator's manipulations. A stop in an illumination optical system in a conventional exposure apparatus determines an effective light source, whereas the variable stop 125 in the illumination optical system 120 is supplemental, and an optical system prior to the fly-eye lens 124 substantially defines an effective light source in the inventive exposure apparatus 1. Therefore, the aperture diameter in the variable stop 125 in the illumination optical system 120 can be uniquely determined according to the projection optical system 300's NA.

Figure 6:
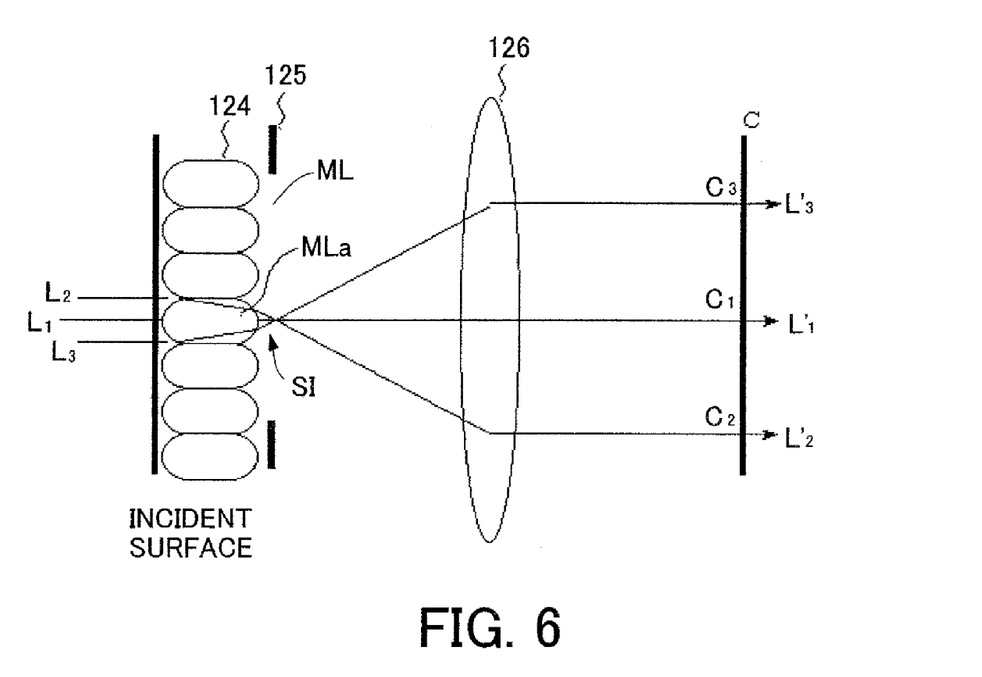
FIG. 6 is a schematic view showing a relationship between the light incident upon the fly-eye lens shown in FIG. 1 and the illuminated surface.

A description will now be given of the reason why the aperture diameter of the variable stop 125 in the illumination optical system 120 is set so that σ is less than or equal to 0.95 rather than σ=1. FIG. 6 is a schematic view showing a relationship between the light incident upon the fly-eye lens 124 shown in FIG. 1 and an illumined surface C. The illuminated surface C is an optically conjugate surface such as the masking blade 127 surface or the reticle 200 surface, with the surface of an object to be exposed (the plate 400 surface).

Rays $L_1$, $L_2$ and $L_3$ incident upon the center fine lens MLa among the fine lenses ML that form the fly-eye lens 124 form one light source image SI due to the fine lens MLa, and Koehler-illuminates the illuminated surface C via the condenser optical system 126. The light source image SI is located at the center of the opening of the variable stop 125, and rays $L_1'$, $L_2'$ and $L_3'$ from the light source image SI constitute principal rays at respective image points $C_1$ to $C_3$. FIG. 6 shows a telecentric system on the illuminated surface C, and shows that when the effective light source is telecentric at respective image points $C_1$ to $C_3$ on the illuminated surface C, the illumination light is telecentric on the plate 400's surface as the object surface to be expected.

The telecentricity of the plate 400's surface is an important factor for the imaging performance. Non-telecentricity leads to an asymmetrical image.

Figure 7:
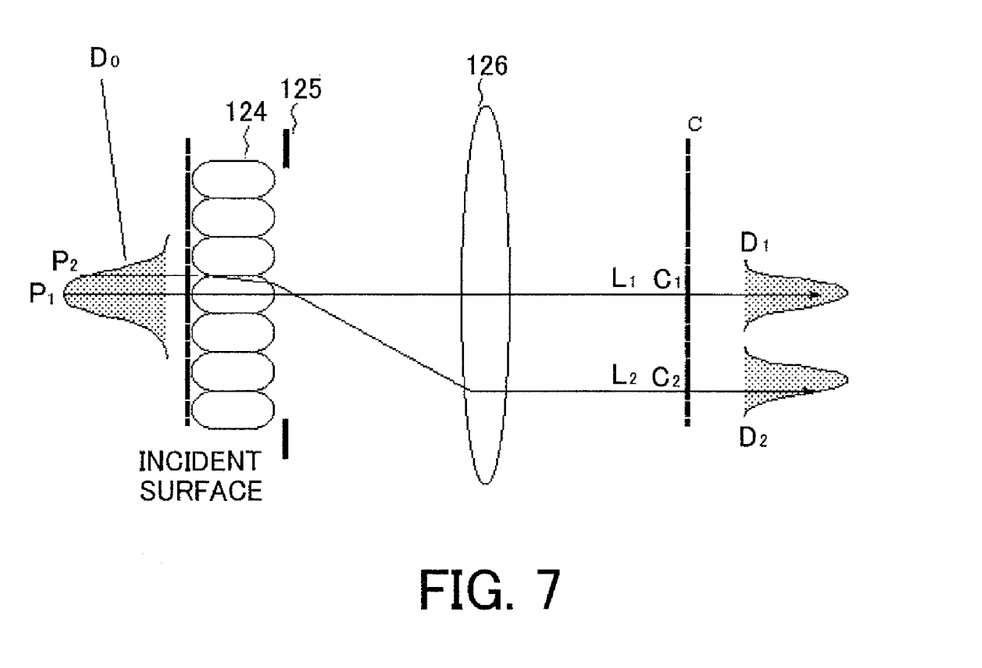
FIG. 7 schematically shows effective light source distributions at respective image points on the illuminated surface when a ray having the light intensity distribution shown in FIG. 2 enters the fly-eye lens shown in FIG. 1.

FIG. 7 is a schematic view of an effective light source distribution at respective image points on the illuminated surface C when the light intensity distribution $D_0$ shown in FIG. 2 enters the fly-eye lens 124 shown in FIG. 1. Referring to FIG. 7, the effective light source distribution $D_1$ at the image point $C_1$ on the illuminated surface C, is similar to the position $P_1$ on the light intensity distribution $D_0$ whose principal ray enters the fly-eye lens 124, and maintains the telecentricity. The effective light-source distribution $D_2$ at the image point $C_2$ at the outermost axis on the illuminated surface C is a distribution corresponding to the light intensity distribution $D_0$ at the position $P_2$ whose principal ray enters the fly-eye lens 124. Therefore, the image point $C_2$ of the illuminated surface C provides the effective light-source distribution $D_2$ that has the telecentricity offset by a half-pitch of the fine lens MLa that forms the fly-eye lens 124.

Light that has a flat sectional light intensity distribution and illuminates an area much larger than the aperture diameter in the variable stop 125 in the illumination optical system 120 also provides the effective light-source distribution that has the telecentricity offset by a half-pitch of the fine lens MLa. This is not a matter because the flat sectional light intensity distribution is maintained even when the telecentricity is offset by a half-pitch. In other words, a problem arises when light that has an unflat sectional light intensity distribution illuminates an area smaller than the aperture diameter in the variable stop 125 in the illumination optical system 120.

Figure 8:
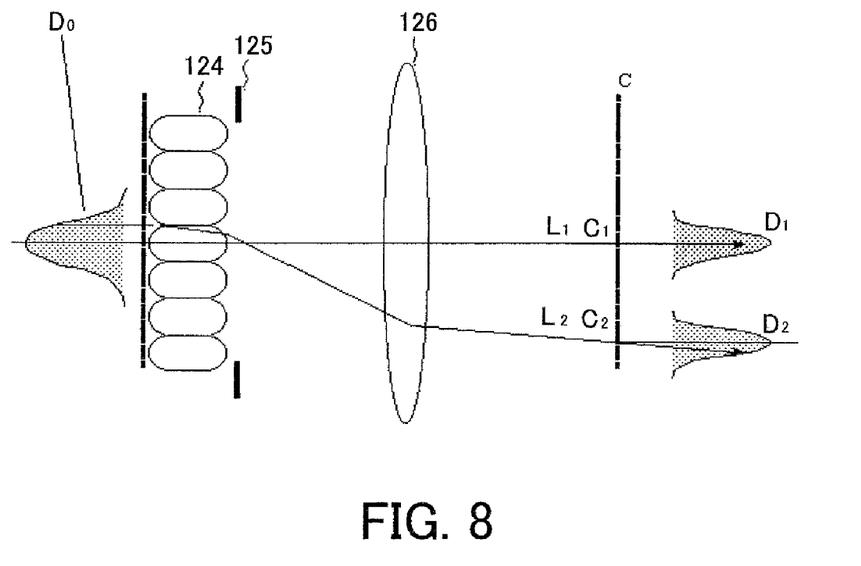
FIG. 8 schematically shows effective light-source distributions at respective image points on the illuminated surface when a ray having the light intensity distribution shown in FIG. 2 enters the fly-eye lens shown in FIG. 1 and the telecentricity of the effective light source distribution is corrected.

FIG. 8 schematically shows that the light having the light intensity distribution $D_0$ shown in FIG. 2 enters the fly-eye lens 124 shown in FIG. 1 and the telecentricity of the effective light source distribution is corrected at each image point on the illuminated surface C. FIG. 8 corrects the inclination of the principal ray (that passes through the center of the variable stop 125) at the image point $C_2$ at the outermost axis of the illuminated surface C in order to correct the telecentricity of the illuminated surface C. Although the inclined principal ray loses the telecentricity, a correction to maintain the telecentricity is available for the effective light source distribution $D_2$ at the image point $C_2$.

The condenser optical system 126 has an adjuster 600 to correct telecentricity. The adjuster 600 serves to vary an interval among optical elements (such as lenses) in the condenser optical system 126 that includes at least two groups of optical systems, and change only the front principal point position of the condenser optical system 126 while hardly changing the focal distance of the condenser optical system 126 and the back principal point position of the condenser optical system 126. In other words, when the adjuster 600 moves, in an optical-axis direction, a position of an image of the variable stop 125 in the illumination optical system 120, which is formed near the aperture stop 310 in the projection optical system 300, the telecentricity of the effective light source is corrected at respective image points. The above system can be realized, for example, by an afocal optical system that has a non-equimultiple magnification and exits approximately parallel light in response to incident parallel light that is set to a front group in the condenser optical system 126, and a position of the front group is made variable in the optical-axis direction.

The light intensity distributions have various telecentric offsets on the incident surface of the fly-eye lens 124, and the adjuster 600 varies a principal point position of the condenser optical system 126 to provide optimal telecentricity, and changes the effective light source shape.

When the focal distance of the condenser optical system 126 slightly changes as the principal point position of the condenser optical system 126 changes and the size of the effective light source on the illuminated surface C consequently changes, a fine adjustment is performed by the magnification of the zooming optical system (123a to 123c).

Figure 9:
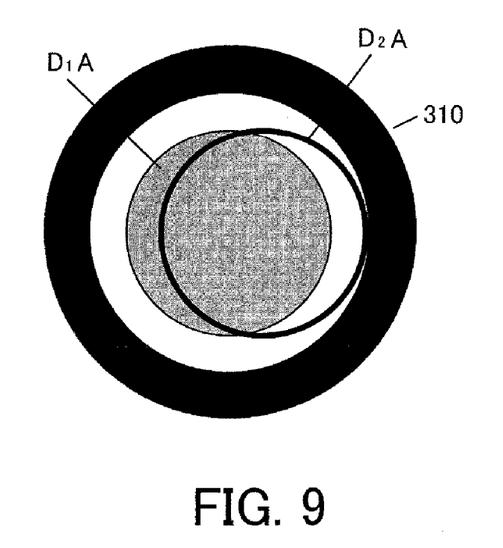
FIG. 9 is a schematic view of an image of a variable stop in the illumination optical system on the aperture stop in the projection optical system shown in FIG. 1.

When the condenser optical system 126 and the adjuster 600 thus vary inclinations at respective image points $C_1$ to $C_3$ of light that passes through the center of the variable stop 125 in the illumination optical system 120, an image of the variable stop 125 at the aperture stop 310 position in the projection optical system 300 is formed, as shown in FIG. 9, so that an image $D_1A$ of the light that passes through the center of the center image point $C_1$ is formed at an aperture position in the aperture stop 310, and an image $D_2A$ of the light that passes through the center of the image point $C_2$ as the outermost axis decenters from the center of an aperture position in the aperture stop 310. Therefore, when a diameter of the image $D_1A$ is set to 1, relative to the aperture diameter of the aperture stop 310 in the projection optical system 300 (or where the mechanical σ=1 in the variable stop 125), the image $D_1A$ projects outside the aperture diameter of the aperture stop 310. Here, FIG. 9 is a schematic view of an image of the variable stop 125 in the illumination optical system 120 at the aperture stop 310 in the projection optical system 300 shown in FIG. 1.

Other factors should be considered, such as scattering sizes and distortions of respective image points and telecentric adjustment margins, the diameter of the image $D_1A$ preferably being limited to about 95% of the aperture stop 310 (or the σ of the geometric shape of the variable stop 125 being 0.95). When the number of fine lenses is small in the fly-eye lens 124 or when the set precision is bad, a small σ is preferable. Here, the scattering sizes and distortions of respective image points result from a decentered optical arrangement between the variable stop 125 in the illumination optical system 120 and the aperture stop 310 in the projection optical system 300, their set precisions, and the aberration of the optical system 126. The telecentric adjustment is necessitated as a result of uneven coating and errors in the optical system.

Figure 10:
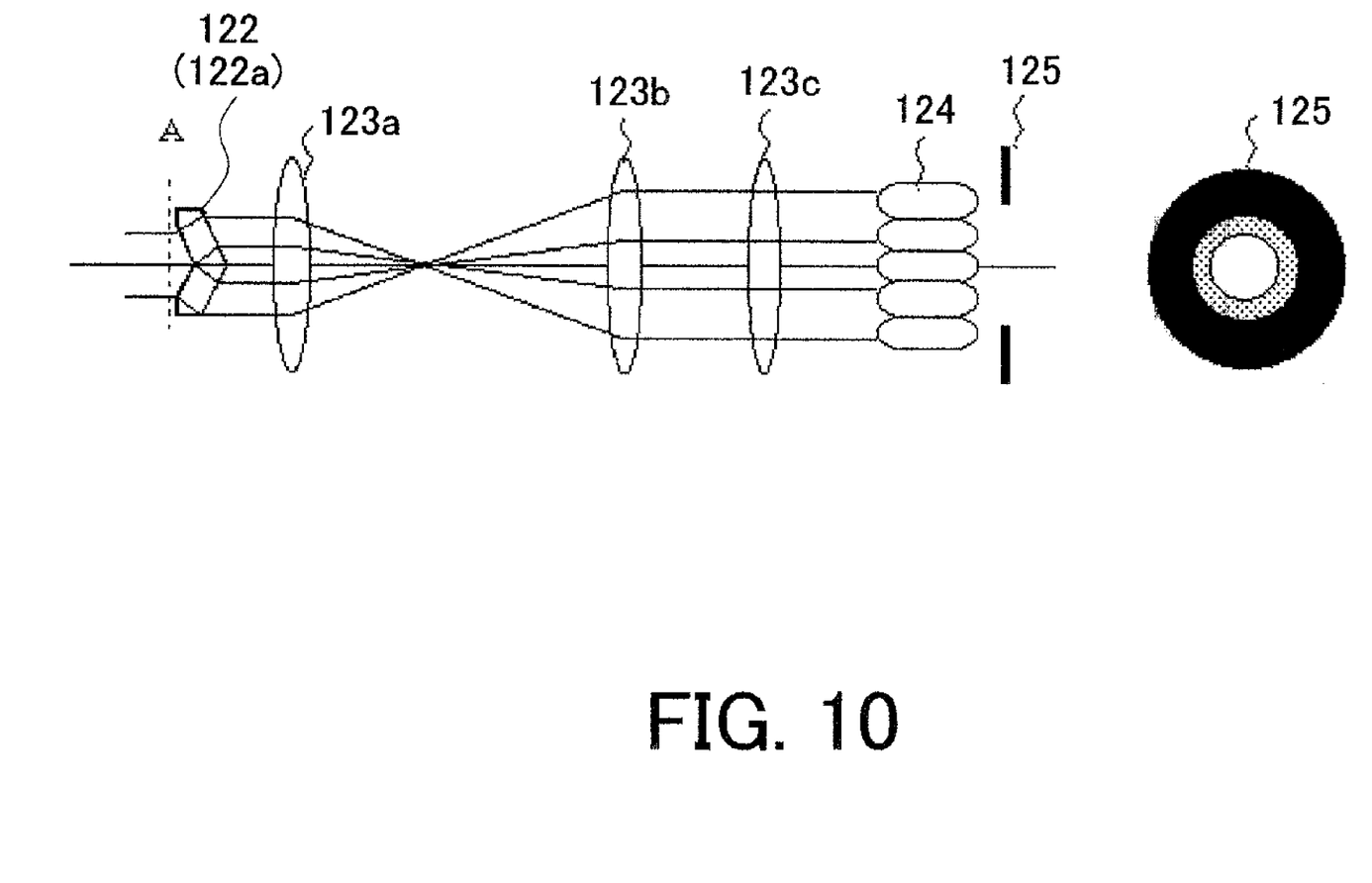
FIG. 10 is an enlarged view of a principal part of the illumination optical system in the exposure apparatus shown in FIG. 1.

FIG. 10 is an enlarged view of a principal part of the illumination optical system 120 in the exposure apparatus 1 shown in FIG. 1. This figure shows an example where the variable stop 125 in the illumination optical system 120 is used to change the effective light source distribution rather than for supplemental use. The shaping means 122 (which is the conical optical element 122a in the instant embodiment) forms a ray having a light intensity distribution with a predetermined annular ratio (e.g., a 1/2 annulus). The zooming optical system (123a to 123c) then properly changes a magnification of the ray having the predetermined annular ratio, and the ray then enters the incident surface of the fly-eye lens 124, forming secondary light sources having the predetermined annular ratio near the exit surface of the fly-eye lens 124. The outside of the light intensity distributions of the multiple light sources is appropriately restricted by changing the aperture diameter of the variable stop 125. Changes of the magnification of the zooming optical system (123a to 123c) and the aperture diameter of the variable stop 125 can form an effective light source having such a desired size as a large annular ratio (such as 2/3 and 3/4 annuluses) irrespective of the annular ratio formed by the shaping means 122.

When the shaping means 122 uses the conical optical element 122b the annular ratio can be varied by changing the interval between the optical elements $OM_1$, and $OM_2$. However, the fly-eye lens 124 is restricted in its incident angle, and when the incident angle exceeds a certain angle, the ray becomes unnecessary, deforms the effective light source, and generates uneven light intensity. Therefore, the incident angle of the light upon the fly-eye lens 124 should be at a certain angle or smaller.

The nature of the light satisfies Ar×Ad≦Br×Bd, where Ar is the radius of the ray shape on the predetermined surface A, Ad is the ray's NA on the predetermined surface A, Br is the radius of the ray on the incident surface of the fly-eye lens 124 or the width of an annular distribution, and Bd is the ray's NA on the incident surface of the fly-eye lens 124. Therefore, when the annular distribution has a small width Br, the ray's NA on the incident surface on the fly-eye lens 124 can exceed the incident angle limit of the fly-eye lens 124.

Therefore, even when the shaping means 122, such as the conical optical element 122b, is used, the annular ratio cannot freely be made large. Therefore, the annular ratio can be effectively changed by setting the interval between the optical elements $OM_1$ and $OM_2$ and the magnification of the zooming optical system (123a to 123c) in the above restricted range of the incident angle upon the fly-eye lens 124, and by changing the aperture diameter of the variable stop 125 in the illumination optical system 120 to reduce the outer diameter.

This is not limited to the annular illumination, but is applicable to the quadrupole illumination and dipole illumination. An effective light source having a desired shape (or a modified illumination) is formed when the shaping means 122 converts a ray into a desired size (one in which a center part has a lower light intensity distribution than that of the peripheral part), and the variable stop 125 in the illumination optical system 120 restricts an outer diameter of the light intensity distribution of a secondary light source formed on the exit surface of the fly-eye lens 124. Even in this case, the controller 500 controls relative to the set NA of the projection optical system 300 so that the variable stop 125 in the illumination optical system 120 has a geometric σ of 0.95 or smaller.

Figure 11:
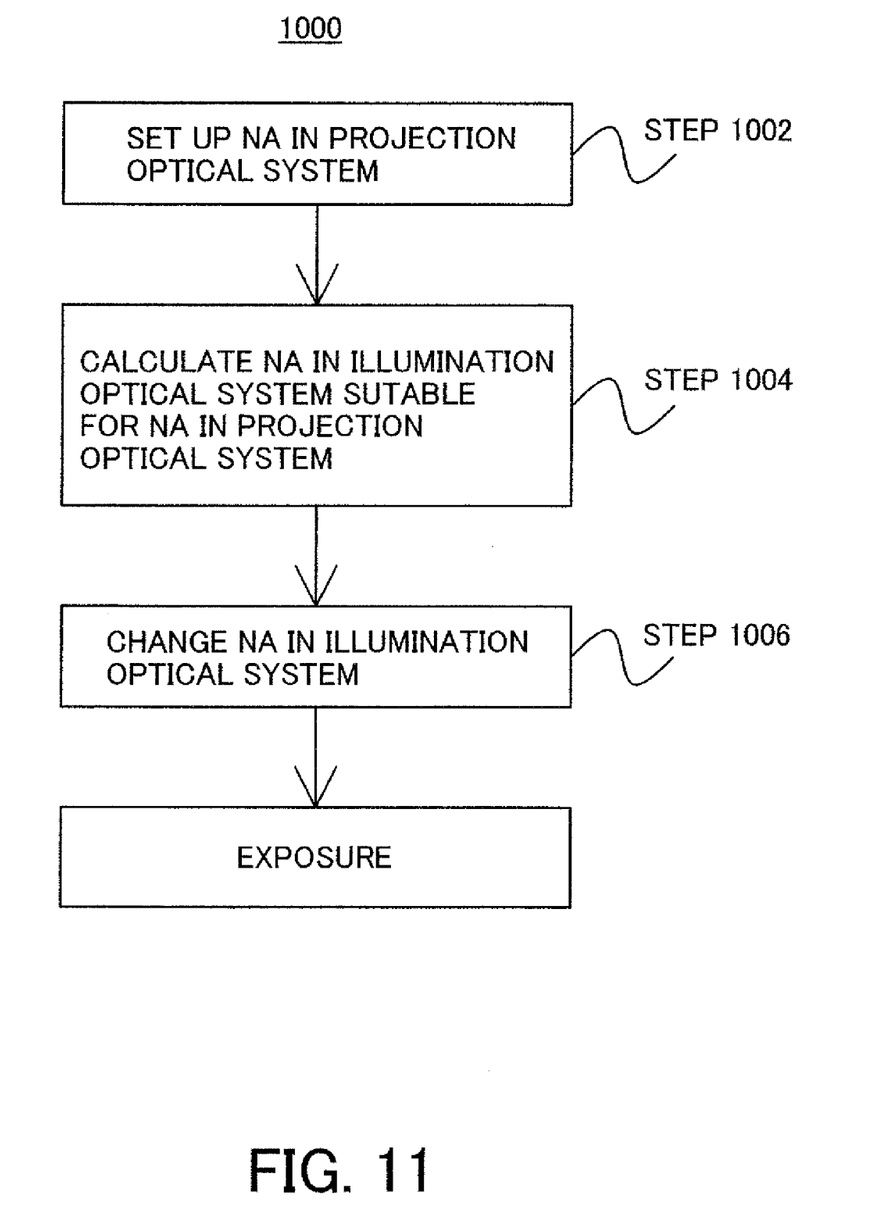
FIG. 11 is a flowchart of an exposure method according to one aspect of the present invention.

A description will be given of an exposure method using the exposure apparatus 1 with reference to FIG. 11. FIG. 11 is a flowchart for explaining the exposure method 1000 as one aspect according to the present invention.

First, an operator sets the projection optical system 300's NA according to the circuit pattern to be transferred onto the plate 400 (or a necessary resolution) (step 1002). The operator can arbitrarily set the projection optical system 300's NA, and the controller 500 changes the aperture diameter of the aperture stop 310 in the projection optical system 300 to adjust the projection optical system 300's NA to the set NA.

The controller 500 calculates the illumination optical system 120's NA suitable for the set NA of the projection optical system 300 so that the 0-th order light from the pattern on the reticle 200 falls within the set NA's aperture in the projection optical system 300, more specifically, the illumination optical system 120's NA/the projection optical system 300's NA≦0.95 (step 1004).

Next, the illumination optical system 120's NA is changed to the NA that was calculated in step 1004 (step 1006). This is done by changing the aperture diameter in the variable stop 125 in the illumination optical system 120 to the set illumination optical system 120's NA to a setting most suitable for the projection optical system 300's NA.

In exposure, light emitted from the light source section 110, for example, Koehler-illuminates the reticle 200 through the illumination optical system 120. The light that has passed and reflects the reticle pattern forms an image on the plate 400 through the projection optical system 300. The exposure apparatus 1 appropriately sets a ratio between the illumination optical system 120's NA and the projection optical system 300's NA, and provides excellent devices (such as semiconductor devices, LCD devices, image pickup devices (such as CCDs), and thin film magnetic heads) with high throughput and economical efficiency. Once the projection optical system 300's NA is set, the controller 500 automatically sets the illumination optical system 120's NA. Therefore, the operator runs the exposure apparatus 1 more easily than a conventional one.

Figure 12:
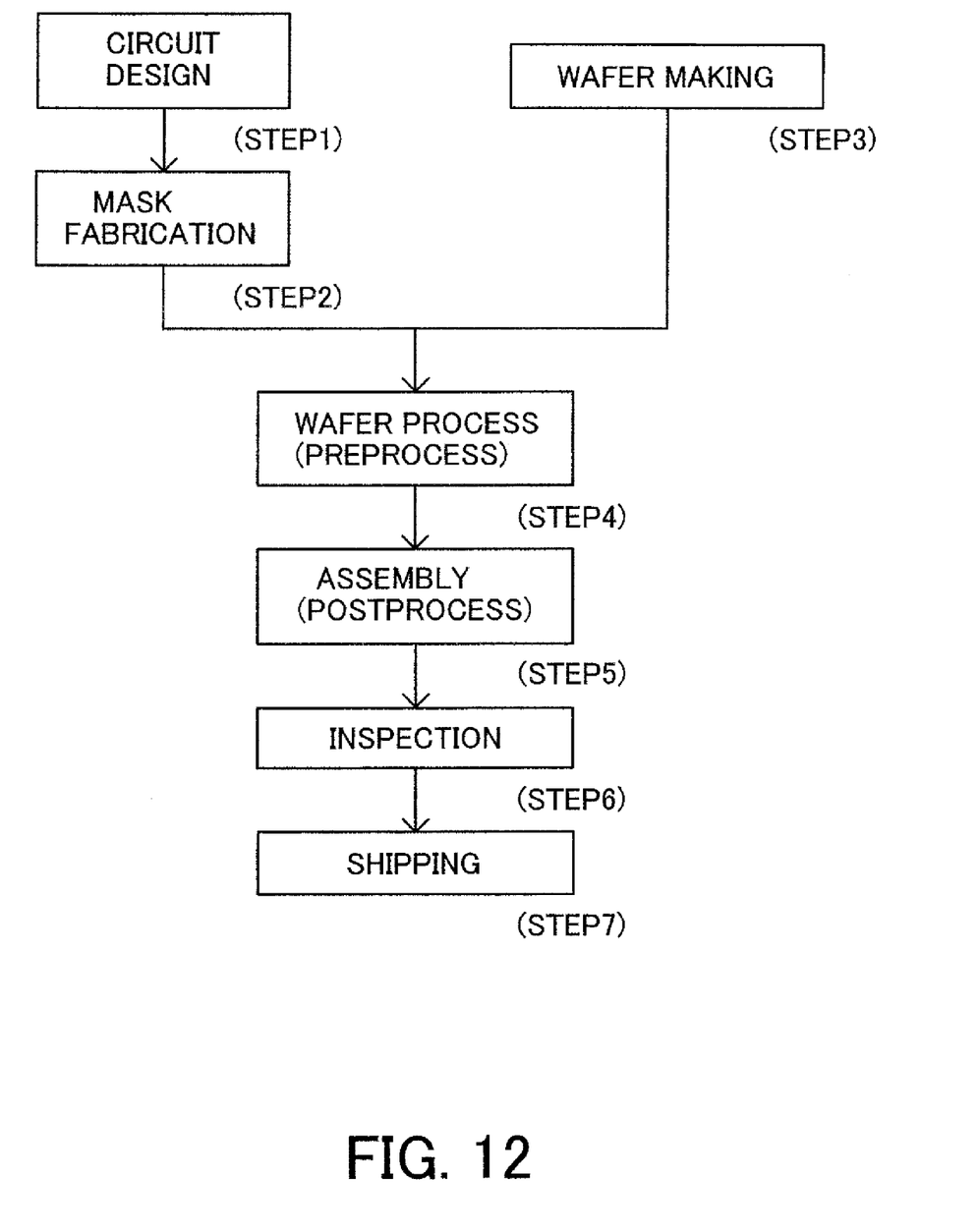
FIG. 12 is a flowchart for explaining how to fabricate devices (like semiconductor chips such as ICs and LCDs, CCDs, and the like).
Figure 13:
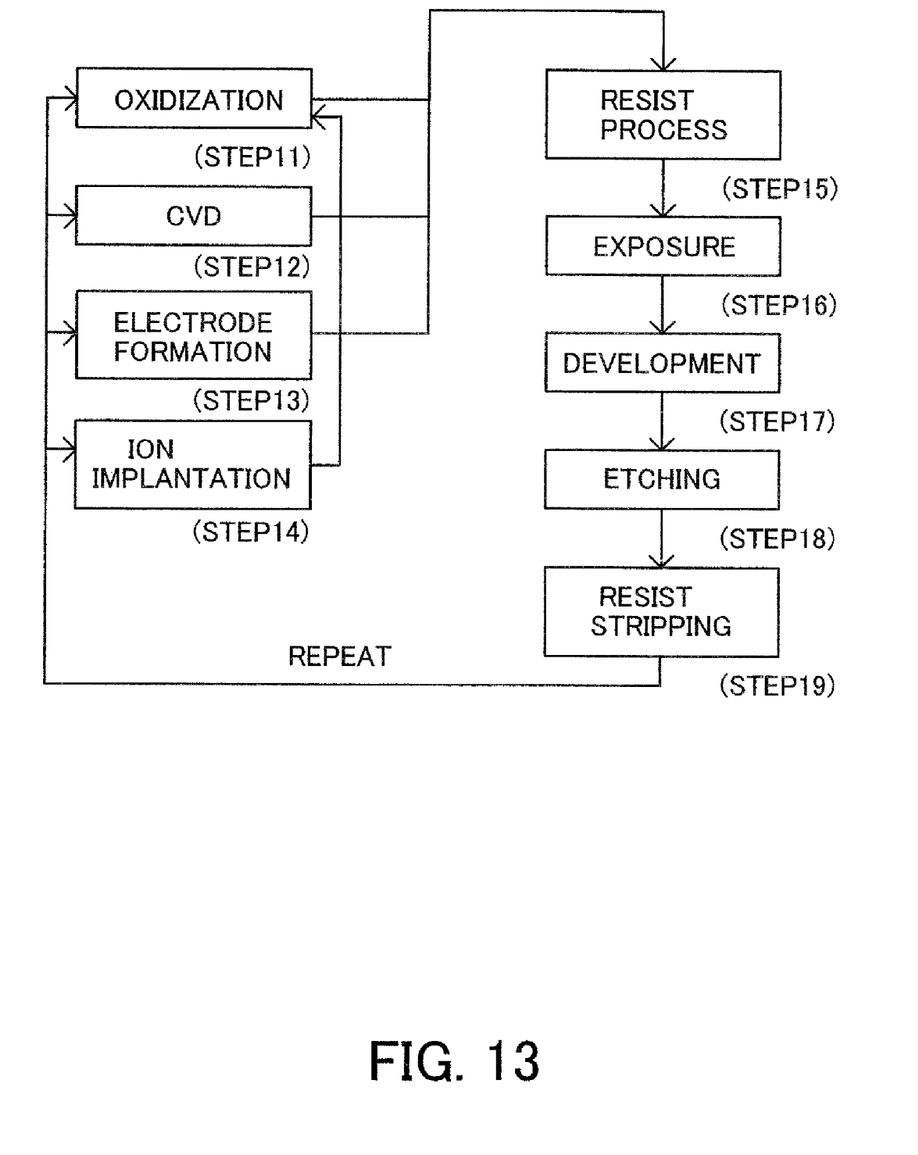
FIG. 13 is a detailed flowchart of the wafer process shown in Step 4 of FIG. 12.

Referring now to FIGS. 12 and 13, a description will be given of an embodiment of a device fabricating method using the above exposure apparatus 1. FIG. 12 is a flowchart for explaining the fabrication of devices (i.e., semiconductor chips such as IC and LSI, LCDs, CCDs, etc.). Here, as an example, a description will be given of the fabrication of a semiconductor chip as an example. Step 1 (circuit design) designs a semiconductor device circuit. Step 2 (reticle fabrication) forms a reticle having a designed circuit pattern. Step 3 (wafer preparation) manufactures a wafer using materials such as silicon. Step 4 (wafer process), which is referred to as a pretreatment, forms actual circuitry on the wafer through photolithography using the reticle and wafer. Step 5 (assembly), which is also referred to as a posttreatment, forms into a semiconductor chip the wafer formed in Step 4 and includes an assembly step (e.g., dicing, bonding), a packaging step (chip sealing), and the like. Step 6 (inspection) performs various tests for the semiconductor device made in Step 5, such as a validity test and a durability test. Through these steps, a semiconductor device is finished and shipped (Step 7).

FIG. 13 is a detailed flowchart of the wafer process in Step 4. Step 11 (oxidation) oxidizes the wafer's surface. Step 12 (CVD) forms an insulating film on the wafer's surface. Step 13 (electrode formation) forms electrodes on the wafer by vapor disposition and the like. Step 14 (ion implantation) implants ions into the wafer. Step 15 (resist process) applies a photosensitive material onto the wafer. Step 16 (exposure) uses the exposure apparatus 200 to expose a circuit pattern on the reticle onto the wafer. Step 17 (development) develops the exposed wafer. Step 18 (etching) etches parts other than a developed resist image. Step 19 (resist stripping) removes disused resist after etching. These steps are repeated, and multilayer circuit patterns are formed on the wafer. The device fabrication method of this embodiment may manufacture higher quality devices than a conventional one. Thus, the device fabrication method that uses the exposure apparatus 1 and devices such as resultant products constitute one aspect of the present invention.

Further, the present invention is not limited to these preferred embodiments, and various variations and modifications may be made without departing from the scope of the present invention. For example, the inventive exposure apparatus can use an optical pipe for the optical integrator, and a fly-eye mirror that includes reflective optical elements for the optical integrator.

The present invention can provide an exposure apparatus that prevents shielding of the illumination light and has excellent imaging performance.

In addition, the present invention can provide an exposure apparatus that minimizes changes in performance (such as efficiency) other than the telecentricity when the telecentricity of the illumination ray shape (or an effective light source shape) is corrected, and has excellent imaging performance.

What is claimed is:

1. An exposure apparatus comprising:
   an illumination optical system for illuminating a reticle using light from a light source, wherein said illumination optical system includes an optical integrator for forming a secondary light source from the light, and a variable stop arranged at or near a position where the secondary light source is formed, the variable stop being configured to vary an aperture diameter that defines a numerical aperture of said illumination optical system;
   a projection optical system for projecting a pattern on the reticle onto an object to be exposed, wherein said projection optical system includes an aperture stop arranged at a position substantially optically conjugate with the variable stop, said aperture stop defining a numerical aperture of said projection optical system; and
   a controller for controlling the aperture diameter of the variable stop in said illumination optical system,
   wherein said optical integrator includes plural optical elements, and wherein said controller controls the aperture diameter of the variable stop in said illumination optical system so that σ is equal to or smaller than (x−1)/x where σ is a ratio of the numerical aperture in said illumination optical system to the numerical aperture in said projection optical system, and x is the number of the optical elements corresponding to σ=1.

2. A device fabricating method comprising the steps of: exposing an object using an exposure apparatus according to claim 1; and developing the object that has been exposed.

* * * * *